United States Patent
Jeon et al.

(10) Patent No.: US 8,227,303 B2
(45) Date of Patent: Jul. 24, 2012

(54) METHODS OF MANUFACTURING CMOS TRANSISTOR

(75) Inventors: Sang-Hun Jeon, Gyeonggi-do (KR); Moon-Sook Lee, Seoul (KR); Byeong-Ok Cho, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/173,670

(22) Filed: Jun. 30, 2011

(65) Prior Publication Data

US 2011/0263081 A1    Oct. 27, 2011

Related U.S. Application Data

(62) Division of application No. 12/506,656, filed on Jul. 21, 2009, now Pat. No. 7,994,581.

(30) Foreign Application Priority Data

Jul. 21, 2008 (KR) .................................. 2008-70685

(51) Int. Cl.
*H01L 21/336* (2006.01)
(52) U.S. Cl. ....................... 438/156; 438/283
(58) Field of Classification Search .................. 438/156, 438/283; 257/E21.409
See application file for complete search history.

(56) References Cited

U.S. PATENT DOCUMENTS

| | | | |
|---|---|---|---|
| 6,806,584 B2 | 10/2004 | Fung et al. | |
| 6,864,131 B2 | 3/2005 | Thornton | |
| 7,638,846 B2 * | 12/2009 | Kitakado et al. | 257/350 |
| 7,646,442 B2 * | 1/2010 | Yang et al. | 349/43 |
| 7,709,844 B2 * | 5/2010 | Yamazaki et al. | 257/72 |
| 7,749,825 B2 * | 7/2010 | Honda | 438/158 |

FOREIGN PATENT DOCUMENTS

JP    10-098371    4/1998

* cited by examiner

*Primary Examiner* — Cuong Q Nguyen
*Assistant Examiner* — Tran Tran
(74) *Attorney, Agent, or Firm* — Myers Bigel Sibley & Sajovec, P.A.

(57) ABSTRACT

A method of manufacturing a CMOS transistor can be provided by forming first and second gate electrodes on a substrate and forming a gate insulation layer on the first and second gate electrodes. A semiconductor channel material having a first conductivity type can be formed on the gate insulation layer. A pair of ohmic contacts can be formed on the semiconductor channel material such that the ohmic contacts cross over both side portions of the first gate electrode, respectively. A pair of Schottky contacts can be formed on the semiconductor channel material such that the Schottky contacts cross over both side portions of the second gate electrode, respectively.

10 Claims, 9 Drawing Sheets

METHODS OF MANUFACTURING CMOS TRANSISTOR

CROSS-REFERENCE TO RELATED APPLICATIONS

This application is a Divisional of U.S. application Ser. No. 12/506,656, filed Jul. 21, 2009 now U.S. Pat. No. 7,994,581, in the United States Patent and Trademark Office, and claims priority from Korean Patent Application No. 10-2008-0070685, filed on Jul. 21, 2008, the entire contents of all of which are hereby incorporated by reference.

BACKGROUND

1. Field

Example embodiments relate to a complementary metal-oxide semiconductor (CMOS) transistor and a method of manufacturing the same. More particularly, example embodiments relate to a CMOS transistor on a semiconductor material layer and a method of manufacturing the same.

2. Description of the Related Art

Nowadays, various electronic communication devices are being produced at low cost. Particularly, electronic chips of the electronic communication devices using radio frequency identification (RFID) technology (hereinafter referred to as RFID chips) are usually manufactured by a printing process for a circuit pattern so as to reduce manufacturing costs.

The RFID chips generally include an RFID passive tag for transferring energy from an RFID reader, and a conventional RFID tag is needed to sense a signal having at least an ultra-high frequency (UHF) which may be more than about 800 MHz. For that reason, the transistors in the conventional RFID chips usually require a relatively high cut-off frequency and various logic circuits having a plurality of p-type metal-oxide semiconductor (PMOS) and n-type metal-oxide semiconductor (NMOS) transistors.

However, the transistor having a high cut-off frequency may be difficult to manufacture using a low-cost printing process. Particularly, the printing process may not be compatible with a material layer comprising semiconductor material having high charge-carrier mobility. For example, when an organic material is used for the semiconductor material layer (since the organic material may be more suitable for the printing process than silicon) the charge-carrier mobility of the organic material may be less than that of the silicon (Si) to thereby increase the operation voltage and threshold voltage of the transistor.

SUMMARY

According to one aspect of example embodiments, a CMOS transistor includes a semiconductor channel material having a first conductivity type on a substrate, a first transistor having the first conductivity type on a first area of the substrate, the first transistor including a first gate electrode positioned on a first surface of the semiconductor channel material and a pair of ohmic contacts positioned on a second surface of the semiconductor channel material that is opposite the first surface and the ohmic contacts cross over two adjoining surfaces of both side portions of the first gate electrode, respectively, and a second transistor having a second conductivity type opposite the first conductivity type on a second area of the substrate, the second transistor including a second gate electrode positioned on the first surface of the semiconductor channel material and a pair of Schottky contacts positioned on the second surface of the semiconductor channel material and the Schottky contacts cross over two adjoining surfaces of both side portions of the second gate electrode, respectively.

BRIEF DESCRIPTION OF THE DRAWINGS

Example embodiments will be more clearly understood from the following detailed description taken in conjunction with the accompanying drawings. FIGS. 1 to 18 represent non-limiting, example embodiments as described herein.

DESCRIPTION OF THE EMBODIMENTS

Various example embodiments will be described more fully hereinafter with reference to the accompanying drawings, in which some example embodiments are illustrated. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein the term "ohmic" refers to layers where an impedance associated therewith is substantially given by the relationship of Impedance=V/I, where V is a voltage across the layer and I is the current, at substantially all expected operating frequencies (i.e., the impedance associated with the ohmic layer is substantially the same at all operating frequencies). For example, in some embodiments according to the invention, an ohmic layer can have a specific resistivity of less than about 10 e-03 ohm-cm2 and, in some embodiments less than about 10 e-04 ohm-cm2. Thus, a layer that is rectifying or that has a high specific resistivity, for example, a specific resistivity of greater than about 10 e-03 ohm-cm2, is not an ohmic layer as that term is used herein.

Embodiment 1

Figure 1:
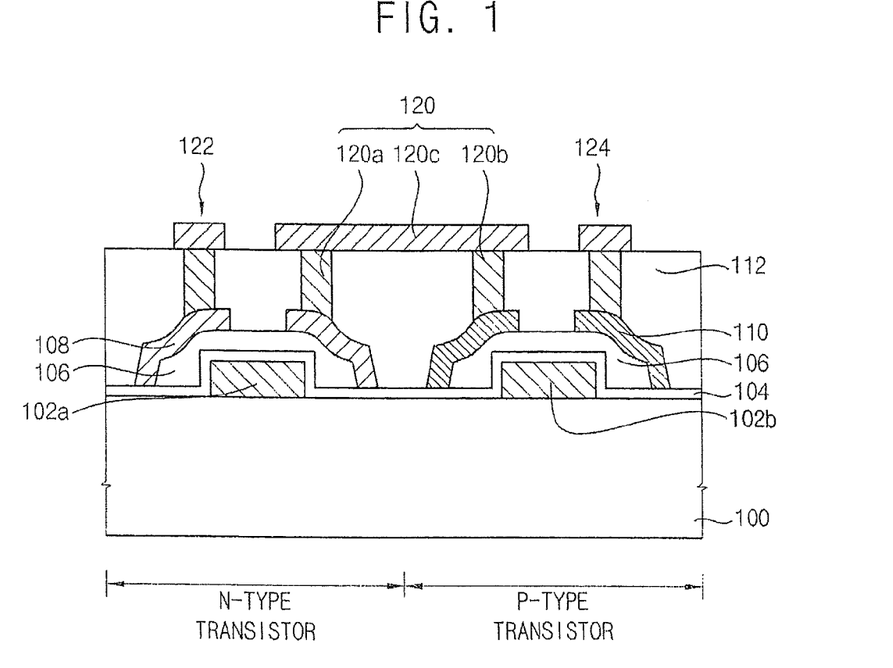
FIG. 1 is a cross-sectional view illustrating a complementary metal-oxide semiconductor (CMOS) transistor in accordance with a first example embodiment of the present inventive concept.
Figure 2:
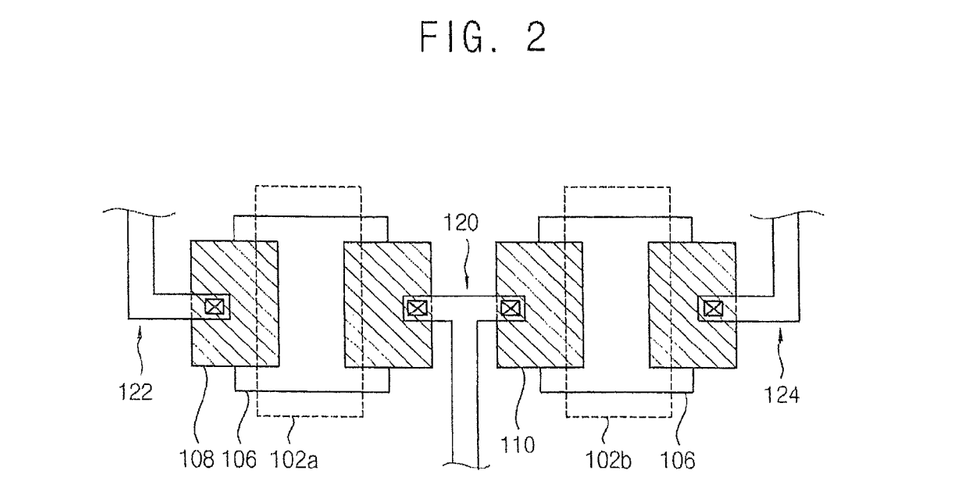
FIG. 2 is a plan view illustrating the CMOS transistor shown in FIG. 1.
Figure 3:
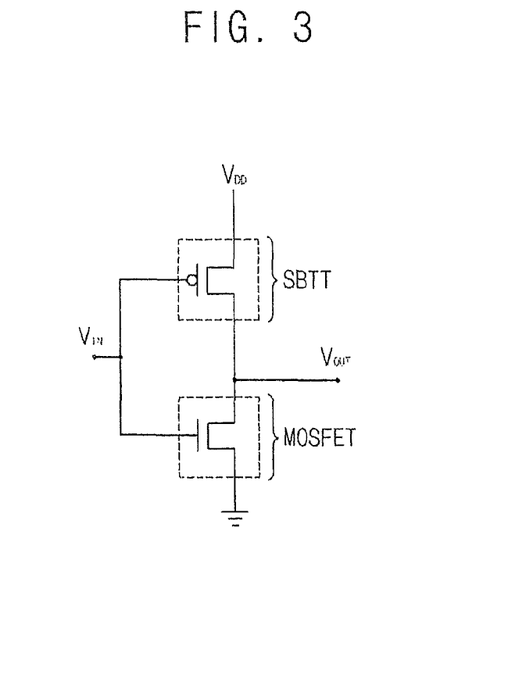
FIG. 3 is a circuit diagram of the CMOS transistor shown in FIG. 1.

FIG. 1 is a cross-sectional view illustrating a complementary metal-oxide semiconductor (CMOS) transistor in accordance with a first example embodiment of the present inventive concept. FIG. 2 is a plan view illustrating the CMOS transistor shown in FIG. 1. FIG. 3 is a circuit diagram of the CMOS transistor shown in FIG. 1.

Referring to FIGS. 1 to 3, first and second gate electrodes 102a and 102b may be positioned on a substrate 100. The substrate 100 may include an insulation material. A gate insulation layer 104 may be positioned on the substrate 100 and the first and the second gate electrodes 102a and 102b.

A semiconductor channel 106 including an n-type semiconductor material, which is referred to as n-type semiconductor channel, may be positioned on the gate insulation layer 104. The n-type semiconductor channel 106 may comprise a semiconductor material, which may be thermodynamically stable, when the conductivity type of the material is n-type conductivity. In the present example embodiment, the n-type semiconductor channel 106 may be formed on the substrate 100 by a doping process with n-type impurities. For example, the n-type semiconductor channel 106 may have a nano-material structure such as a nano-wire structure, a nano-tube structure and a nano-ribbon structure. In addition, the nano-structured material for the n-type semiconductor channel 106 may be sufficiently processed by a printing process.

Examples of the semiconductor material, which may be thermodynamically stable when the conductivity type of the material is n-type conductivity, may include ZnO, ZnSe and GaN. However, various other n-type semiconductor materials may be used for the semiconductor channel 106, as would be known to one of the ordinary skill in the art. Examples of the n-type semiconductor materials may include Si, SiGe, CdS, V2O5, NiO, GaAs, ZnS, ZnTe, CdSe, CdTe, HgSe, HgTe, AlInP, AlGaAs, AlInAs, AlGaSb, AlInSb, GaInP, GaInAs, GaInSb, GaPAs, GaAsSb, InPAs, InAsSb and metal alloys thereof. These may be used alone or in combinations thereof.

The semiconductor material having a nano-wire structure, a nano-tube structure or a nano-ribbon structure may be formed into an n-type or a p-type material layer doped with n-type or p-type impurities because the above nano-structured semiconductor material is inherently unstable in view of thermodynamics. In addition, the formation of a material layer using an electrically unstable semiconductor material usually requires a high-cost manufacturing apparatus and an excessively complicated manufacturing process. Thus, the n-type semiconductor channel 106 may comprise an n-type semiconductor material.

When the semiconductor channel 106 comprises an organic material, the transistor having the semiconductor channel 106 may have poor charge-carrier mobility, a low operation voltage and a low threshold voltage. For those reasons, the semiconductor channel comprising an organic material may not be suitable for a transistor that requires high electrical and operational characteristics. In contrast, when the semiconductor channel 106 comprises a nano-structured material to which a printing process may be sufficiently performed, the charge-carrier mobility through the semiconductor channel 106 may be relatively increased, and thus the transistor including the semiconductor channel 106 may be operated at high speed by a relatively lower voltage.

A pair of ohmic contacts 108 may make contact with the n-type semiconductor channel 106 at both side portions thereof over the first gate electrode 102a. Thus, the first gate electrode 102a may be covered with the n-type semiconductor channel 106 and both of the side surfaces of the n-type semiconductor channel 106 over the first gate electrode 102a may be covered with the ohmic contacts 108. The pair of the ohmic contacts 108 may function as a first source electrode and a first drain electrode, respectively. In the present example embodiment, the ohmic contact 108 may have a work function lower than that of the n-type semiconductor channel 106.

In a case where the n-type semiconductor channel 106 comprises ZnO, the ohmic contact 108 may comprise a first conductive metal. Examples of the first conductive metal may include aluminum (Al), titanium (Ti), scandium (Sc), hafnium (Hf), etc. These may be used alone or in combinations thereof. In addition, the ohmic contact 108 may have a single-layer structure or a multilayer structure.

Accordingly, the n-type semiconductor channel 106, the gate insulation layer 104, the first gate electrode 102a and the ohmic contact 108 may function as an n-type transistor of the CMOS transistor of the present inventive concept. In the present example embodiment, the n-type transistor may include a metal-oxide semiconductor field-effect transistor (MOSFET).

A pair of Schottky contacts 110 may make contact with the n-type semiconductor channel 106 at both side portions thereof over the second gate electrode 102b. Thus, the second gate electrode 102b may be covered with the n-type semiconductor channel 106 and both of the side surfaces of the n-type semiconductor channel 106 over the second gate electrode 102b may be covered with the Schottky contacts 110. The pair of the Schottky contacts 110 may function as a second source electrode and a second drain electrode, respectively. In the present example embodiment, the Schottky contact 110 may have a work function higher than that of the n-type semiconductor channel 106.

In a case where the n-type semiconductor channel 106 comprises ZnO, the Schottky contact 110 may comprise a second conductive metal. Examples of the second conductive metal may include platinum (Al), InGaSnO, etc. etc. These may be used alone or in combinations thereof. In addition, the Schottky contact 110 may have a single-layer structure or a multilayer structure.

Accordingly, the n-type semiconductor channel 106, the gate insulation layer 104, the second gate electrode 102b and the Schottky contact 110 may function as a p-type transistor of the CMOS transistor of the present inventive concept. In the present example embodiment, the p-type transistor may include a Schottky barrier tunneling transistor (SBTT).

In an example embodiment, a protection layer 112 may be positioned on the ohmic and Schottky contact 108 and 110.

In an example embodiment, the first and second gate electrodes 102a and 102b may be electrically connected with each other. For example, end portions of the first and second gate electrodes 102a and 102b may be connected with each other. In another example, the first and second gate electrodes 102a and 102b may be electrically connected with each other by a first metal wiring (not shown). The first and second gate electrodes 102a and 102b function as a common input.

One of the ohmic contacts 108 and one of the Schottky contacts 110 may be connected with each other by a second wiring 120. For example, the second wiring 120 may include contact plugs 120a and 120b and a conductive line 120c and may be electrically connected to the ohmic and Schottky contacts 108 and 110 functioning as the first and the second drain electrodes, respectively. The second wiring 120 may comprise metal and functions as a common output. In the present example, the common input and output may be connected to an input terminal and an output terminal, respectively.

In an example embodiment, a third wiring 122 may be connected to the ohmic contact 108 functioning as the first source electrode and a fourth wiring 124 may be connected to the Schottky contact 110 functioning as the second source electrode.

Hereinafter, operations of the MOSFET including the ohmic contact 108 and the Schottky barrier tunneling transistor including the Schottky contact 110 will be described in detail using energy band diagrams.

Figure 4:
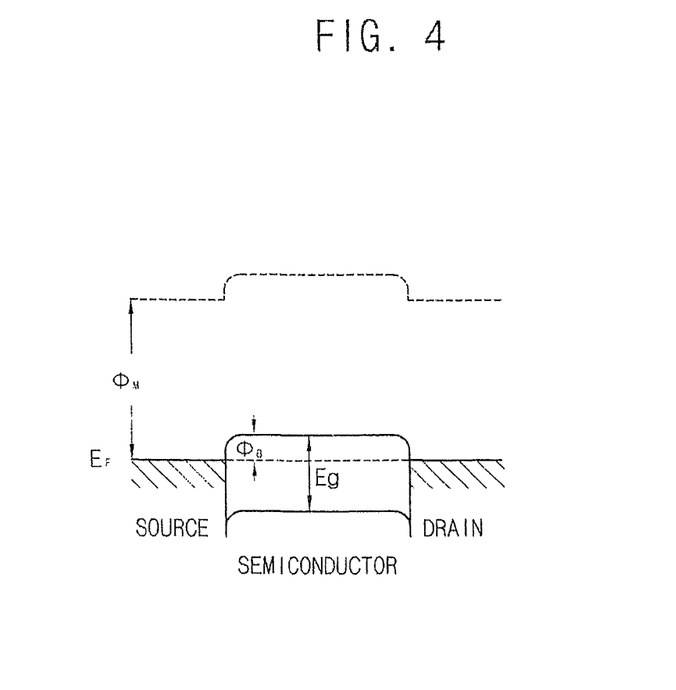
FIG. 4 is a band diagram showing an energy state when an ohmic contact makes contact with an n-type semiconductor channel.
Figure 5:
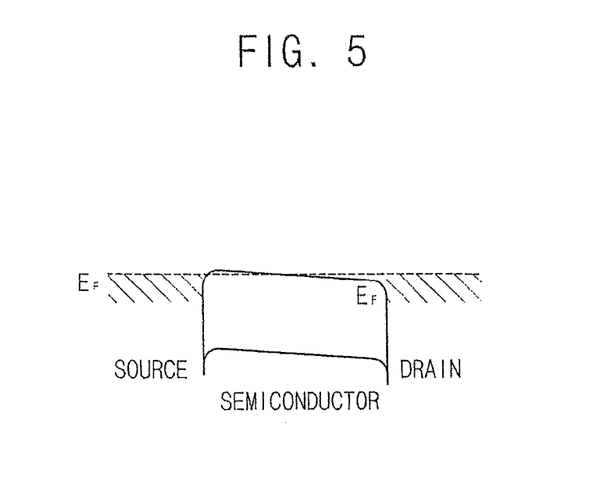
FIG. 5 is a band diagram showing an energy state when a metal-oxide semiconductor field-effect transistor (MOSFET) including the ohmic contact making contact with the n-type semiconductor channel is operated.

FIG. 4 is a band diagram showing an energy state when the ohmic contact 108 makes contact with the n-type semiconductor channel 106. FIG. 5 is a band diagram showing an energy state when the MOSFET including the ohmic contact making contact with the n-type semiconductor channel 106 is operated.

Referring to FIG. 4, the first conductive metal of the ohmic contact 108 may have a Fermi level higher than that of the n-type semiconductor channel 106. Thus, when the ohmic contact 108 makes contact with the semiconductor channel 106, two Fermi levels of the ohmic contact portion 108 and the semiconductor channel 106 may be aligned with each other. As a result, a vacuum level, a conduction band and a valance band of the ohmic contact 108 and the semiconductor channel 106 may be distorted and bent according to the affinity and the energy bandgap between the ohmic contact 108 and the semiconductor channel 106.

Therefore, an energy barrier may be generated between the ohmic contact 108 and the semiconductor channel 106. For example, the energy barrier may correspond to the energy difference between the Fermi energy of the n-type semiconductor channel 106 and the conduction band energy, to thereby prevent electrical current from flowing from the first source electrode to the first drain electrode.

Referring to FIG. 5, when a positive voltage is applied to the first gate electrode 102a of the n-type transistor in which the ohmic contact 108 may make contact with semiconductor channel 106 as the first source electrode and the second drain electrode, the energy band of the n-type semiconductor channel 106 may become lower to reach the threshold voltage of the transistor. Therefore, when a positive voltage is applied to the first drain electrode, an electrical current may flow from the first source electrode to the first drain electrode.

That is, the transistor including the ohmic contact 108 may be electrically turned on as a positive voltage may be applied to the first gate electrode 102a, and thus the transistor including the ohmic contact 108 may function as an n-type MOSFET.

In an example embodiment, since the n-type semiconductor channel 106 may comprise a nano-structured semiconductor material, a one-dimensional channel may be formed between the first source electrode and the first drain electrode. Therefore, a junction leakage current from each of the first source electrode and the first drain electrode may be sufficiently reduced in the n-type transistor.

Figure 6:
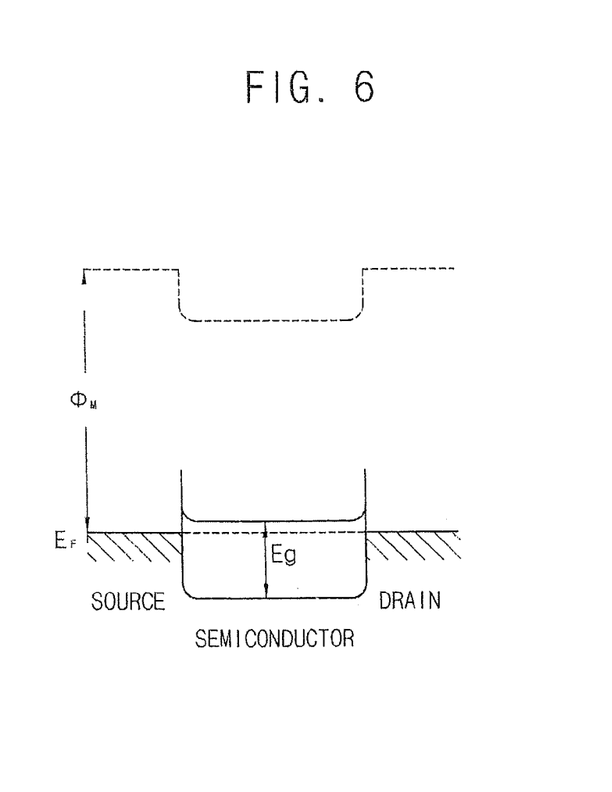
FIG. 6 is a band diagram showing an energy state when a Schottky contact makes contact with the n-type semiconductor channel.
Figure 7:
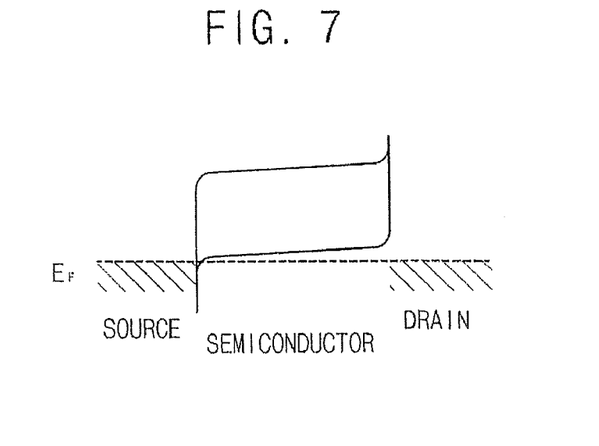
FIG. 7 is a band diagram showing an energy state when an Schottky barrier tunneling transistor including the Schottky contact making contact with the n-type semiconductor channel is operated.

FIG. 6 is a band diagram showing an energy state when the Schottky contact 110 makes contact with the n-type semiconductor channel 106. FIG. 7 is a band diagram showing an energy state when the SBTT including the Schottky contact 110 making contact with the n-type semiconductor channel 106 is operated.

Referring to FIG. 6, the second conductive metal of the Schottky contact 110 may have a Fermi level lower than that of the n-type semiconductor channel 106. Thus, when the Schottky contact 110 makes contact with the semiconductor channel 106, two Fermi levels of the Schottky contact portion 110 and the semiconductor channel 106 may be aligned with each other. As a result, a vacuum level, a conduction band and a valance band of the Schottky contact 110 and the semiconductor channel 106 may be distorted and bent according to the affinity and the energy bandgap between the Schottky contact 110 and the semiconductor channel 106.

Therefore, the Schottky barrier may be formed at a Schottky junction, and thus the electrical current may be prevented from flowing from the second source electrode and to the second drain electrode.

Referring to FIG. 7, when a negative voltage is applied to the second gate electrode 102b of the p-type transistor in which the Schottky contact 110 may make contact with semiconductor channel 106 as the second source electrode and the second drain electrode, the energy band of the n-type semiconductor channel 106 may become higher. Therefore, when a negative voltage is applied to the second drain electrode, the Schottky barrier may be lowered, and thus an electrical current may flow from the second source electrode to the second drain electrode.

That is, the transistor including the Schottky contact 110 may be electrically turned on as a negative voltage may be applied to the second gate electrode 102b, and thus the SBTT including the Schottky contact 110 may function as a p-type transistor.

The CMOS transistor of the first example embodiment of the present inventive concept includes the n-type and the p-type transistors that are formed on the same conductivity type channel 106. Particularly, the n-type transistor may include an n-type MOSFET and the p-type transistor may include the SBTT. For those reasons, the current leakage may be sufficiently reduced in the CMOS transistor when the CMOS is turned off.

Accordingly, the CMOS transistor of the present example embodiment may have on-off operation characteristics much better than those of the conventional CMOS transistor having an enhancement-type or a depletion-type load inverter structure in which two n-type transistors are arranged. As a result, the power consumption of the CMOS transistor of the present example embodiment may be sufficiently reduced to such a degree that the power consumption may be negligible on standby mode.

Figure 8:
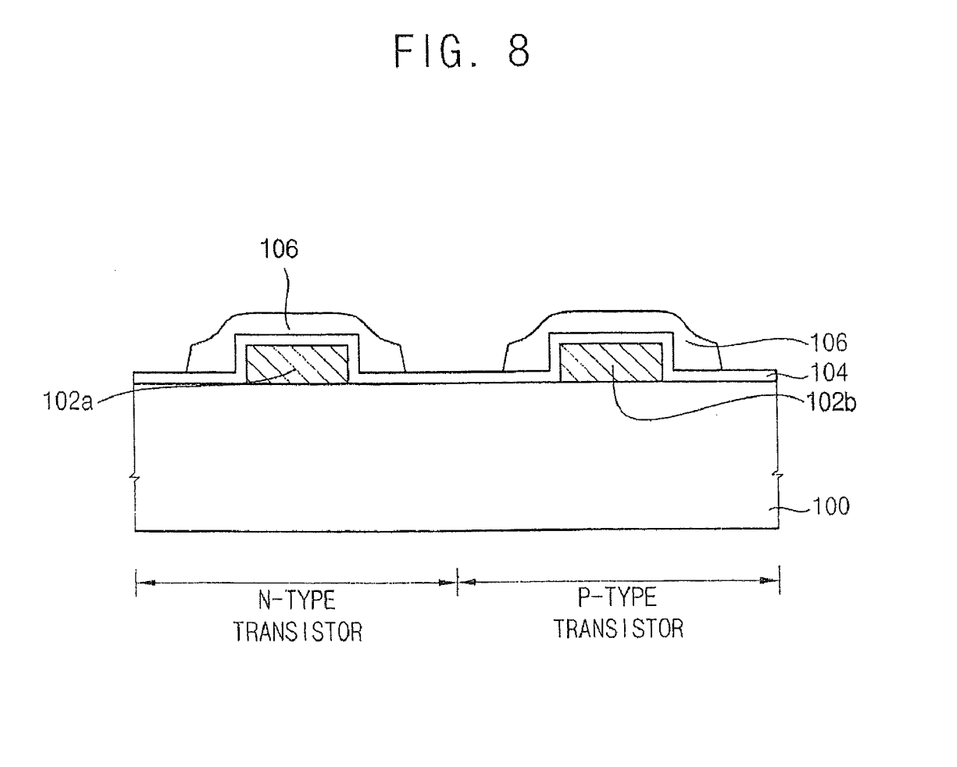
FIGS. 8 to 10 are cross-sectional views illustrating a method of manufacturing the CMOS transistor shown in FIG. 1.
Figure 9:
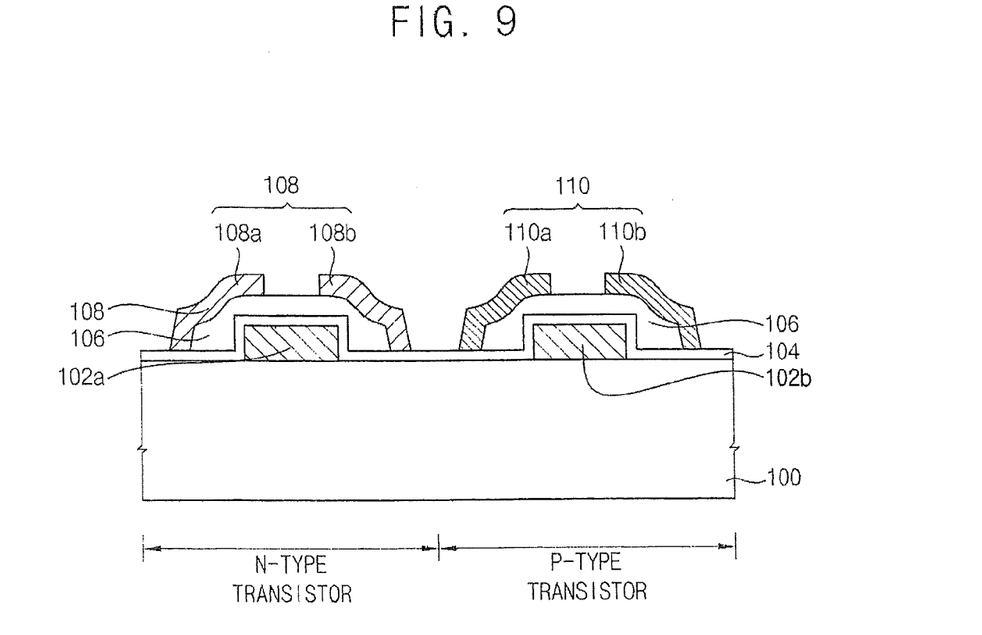
Figure 10:
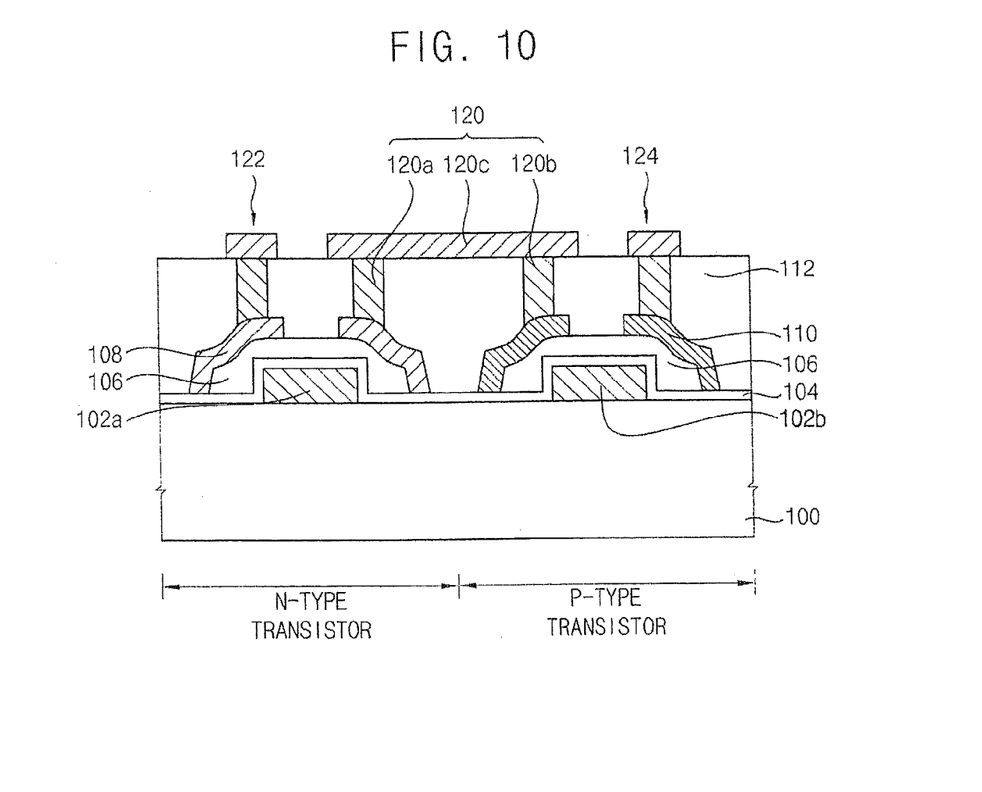

FIGS. 8, 9 and 10 are cross-sectional views illustrating a method of manufacturing the CMOS transistor shown in FIG. 1.

Referring to FIG. 8, the first and second gate electrodes 102a and 102b may be formed on the substrate 100. The substrate 100 may include insulation material such as a plastic material. The first and second gate electrodes 102a and 102b may be formed by a metal deposition in a printing process. The gate insulation layer 104 may be formed on the substrate 100 including the gate electrode 102a and 102b. Thus, the first and second gate electrodes 102a and 102b and the gate insulation layer 104 may be sequentially stacked on the substrate 100 to thereby form first and second gate structures on the substrate 100.

Then, the n-type semiconductor channel 106 may be formed on the first and second gate structures by a printing process. In the present example embodiment, the semiconductor channel 106 may have a surface area larger than that of the first and second gate electrodes 102a and 102b, and thus the first and second gate electrodes 102a and 102b may be covered with the semiconductor channel 106. The n-type semiconductor channel 106 may include a first channel covering the first gate electrode 102a and a second channel covering the second gate electrode 102b.

In an example embodiment, the n-type semiconductor channel 106 may comprise a semiconductor material having a nano-wire structure, a nano-tube structure, or a nano-ribbon structure.

Particularly, the n-type semiconductor channel 106 may be formed by depositing the semiconductor material, which may be thermodynamically stable, when the conductivity type of the material is n-type conductivity in a printing process. Examples of the semiconductor material may include ZnO, ZnSe or GaN.

Alternatively, the n-type semiconductor channel 106 may be formed through a deposition process using various semiconductor materials, such as Si, SiGe, CdS, $V_2O_5$, NiO, GaAs, ZnS, ZnTe, CdSe, CdTe, HgSe, HgTe, AlInP, AlGaAs, AlInAs, AlGaSb, AlInSb, GaInP, GaInAs, GaInSb, GaPAs, GaAsSb, InPAs, InAsSb, a metal alloy thereof, etc. These may be used alone or in combinations thereof.

Referring to FIG. 9 a pair of the ohmic contacts 108 may be formed on both side portions of the n-type semiconductor channel 106, and thus may be positioned over both side portions of the first gate electrode 102a. The ohmic contacts 108 may functions as the first source electrode 108a and the first drain electrode 108b. The ohmic contact 108 may be formed by depositing a material having a work function lower than that of the n-type semiconductor channel 106 in a printing process.

Further, a pair of the Schottky contacts 110 may be formed on both side portions of the n-type semiconductor channel 106, and thus may be positioned over both side portions of the second gate electrode 102b. The Schottky contact 110 may function as the second source electrode 110a and the second drain electrode 110b. The Schottky contact portions 110 may be formed by depositing a material having a work function higher than that of the n-type semiconductor channel 106 in a printing process.

While the above example embodiment discloses that the ohmic contact 108 may be formed prior to the Schottky contact 110, any changes of the formation order of the ohmic contact 108 and the Schottky contact 110 may be allowable, as would be known to one of the ordinary skill in the art.

Accordingly, the n-type semiconductor channel 106, the gate insulation layer 104, the first gate electrode 102a and the ohmic contacts 108 functioning as the first source electrode and the first drain electrode may be formed into an n-type transistor of the CMOS transistor of the present inventive concept. In addition, the n-type semiconductor channel 106, the gate insulation layer 104, the second gate electrode 102b and the Schottky contacts 110 functioning as the second source electrode and the second drain electrode may be formed into a p-type transistor of the CMOS transistor of the present inventive concept.

Referring to FIG. 10, a protection layer 112 may be formed on the substrate 100 to cover the ohmic and Schottky contact 108 and 110.

Then, the protection layer 112 is partially etched to form first and second openings partially exposing the ohmic and Schottky contact 108 and 110, respectively. In addition, a third opening may be formed in such a manner that the first and second gate electrodes 102a and 102b may be connected to each other.

In an example embodiment, conductive materials may be filled into the first, second and third openings, to thereby form first and second contact plugs 120a and 120b and a third contact plug (not shown).

A first conductive line (not shown) may be formed on the protection layer 120, and thus a plurality of the third contact plugs may be connected to each other. The third contact plug and the first conductive line may be formed into a first wiring functioning as an input port of the CMOS transistor. In the present example embodiment, the first conductive line of the first wiring may be connected to an external input terminal, and thus input signals may be transferred to the first and second gate electrodes 102a and 102b.

In an example embodiment, the first contact plug 120a may be connected to the first drain and the second contact plugs 120b may be connected to the second drain, and a second conductive line 120c may be formed in such a manner that the first and second contact plugs 120a and 120b may be connected to each other. The first and the second contact plugs 120a and 120b and the second conductive line 120a may be formed into a second wiring 120 functioning as an output port of the CMOS transistor. In the present example embodiment, the second conductive line 120c of the second wiring 120 may be connected to an external output terminal, and thus output signals may be outwardly transferred from the CMOS transistor.

Further, a third wiring 122 electrically connected to the first source electrode may be formed on the protection layer 112 and a fourth wiring 124 electrically connected to the second source electrode may be formed on the protection layer 112.

According to the first example embodiment of the present inventive concept, an n-type MOSFET and a p-type SBTT may be formed on the same semiconductor channel having a single conductivity type, to thereby manufacture a CMOS transistor of the present inventive concept. In addition, the CMOS transistor may be manufactured on a semiconductor channel to which a printing process may be performed instead of on an expensive single-crystal semiconductor substrate, to thereby sufficiently reduce manufacturing costs of the CMOS transistor. In addition, since the current leakage from the SBTT may be negligible when the SBTT is turned off, the CMOS transistor including the SBTT may have excellent on/off operation characteristics and low power consumption.

Embodiment 2

Figure 11:
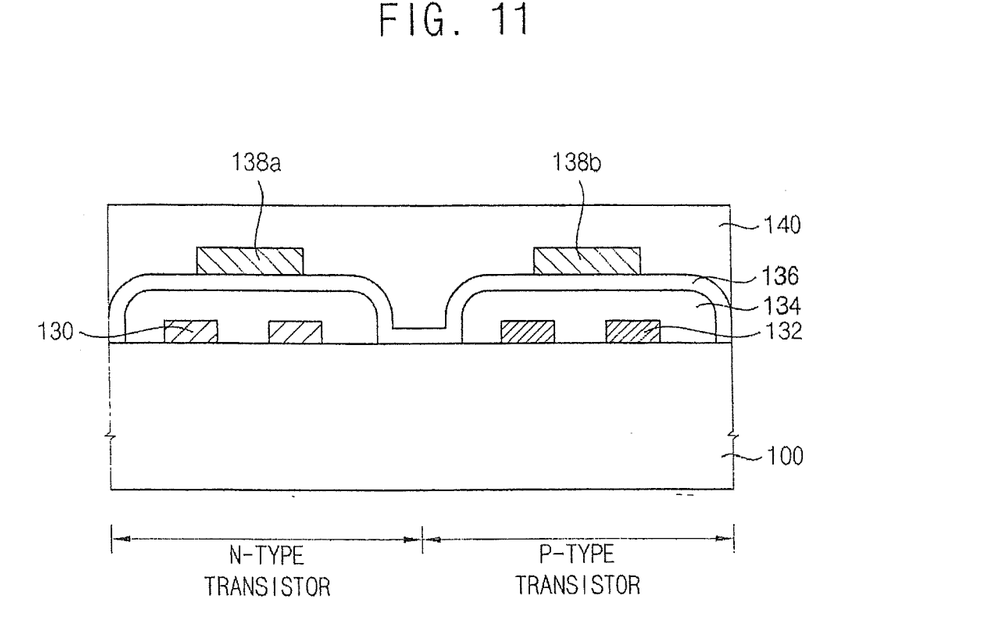
FIG. 11 is a cross-sectional view illustrating a CMOS transistor in accordance with a second example embodiment of the present inventive concept.

FIG. 11 is a cross-sectional view illustrating a CMOS transistor in accordance with a second example embodiment of the present inventive concept.

The CMOS transistor according to the second example embodiment may have the same structure as the CMOS transistor according to the first example embodiment, except that the n-type and p-type transistors in the CMOS may have a top gate structure. In addition, the circuit diagram of the CMOS transistor shown in FIG. 11 may be the same as the circuit diagram shown in FIG. 2.

Referring to FIG. 11, a pair of ohmic contacts 130 may be formed on a substrate 100 and the ohmic contacts 130 may function as a first source electrode and a first drain electrode. For example, the substrate 100 may comprise an insulation material and the ohmic contact 130 may comprise a metal material having a work function lower than that of an n-type semiconductor channel.

In an example embodiment, a pair of Schottky contacts 132 may be formed on the substrate 100 and the Schottky contacts 132 may function as a second source electrode and a second drain electrode. For example, the Schottky contact 132 may comprise a metal material having a work function higher than that of an n-type semiconductor channel.

An n-type semiconductor channel 134 may be positioned on the substrate 100 in such a manner that the ohmic contacts 130 and the Schottky contacts 132 may be covered with the channel 134, respectively. For example, the n-type semiconductor channel 134 may include the same material as described in Embodiment 1.

A gate insulation layer 136 may be formed on the semiconductor channel 134 and the substrate 100. A first gate electrode 138a may be positioned on the gate insulation layer 136 in such a configuration that the first gate electrode 138a may cross over the ohmic contacts 130. Accordingly, the gate insulation layer 136, the first gate electrode 138a and the first source and drain electrodes of the ohmic contacts 130 may function as an n-type transistor of the CMOS transistor of the present inventive concept.

Further, a second gate electrode 138b may be positioned on the gate insulation layer 136 in such a configuration that the second gate electrode 138b may cross over the Schottky contacts 132. Accordingly, the gate insulation layer 136, the second gate electrode 138b and the second source and drain electrodes of the Schottky contacts 132 may function as a p-type transistor of the CMOS transistor of the present inventive concept.

A protection layer 140 may be positioned on the gate insulation layer 136 and have a sufficient thickness to cover the first and second gate electrodes 138a and 138b.

The first and second gate electrodes 138a and 138b may be electrically connected to each other through a first wiring (not shown) and the first and the second drain electrodes may be electrically connected with each other through a second wiring (not shown) in the same structure as described in Embodiment 1. For example, the first and second wirings may comprise a metal.

Figure 12:
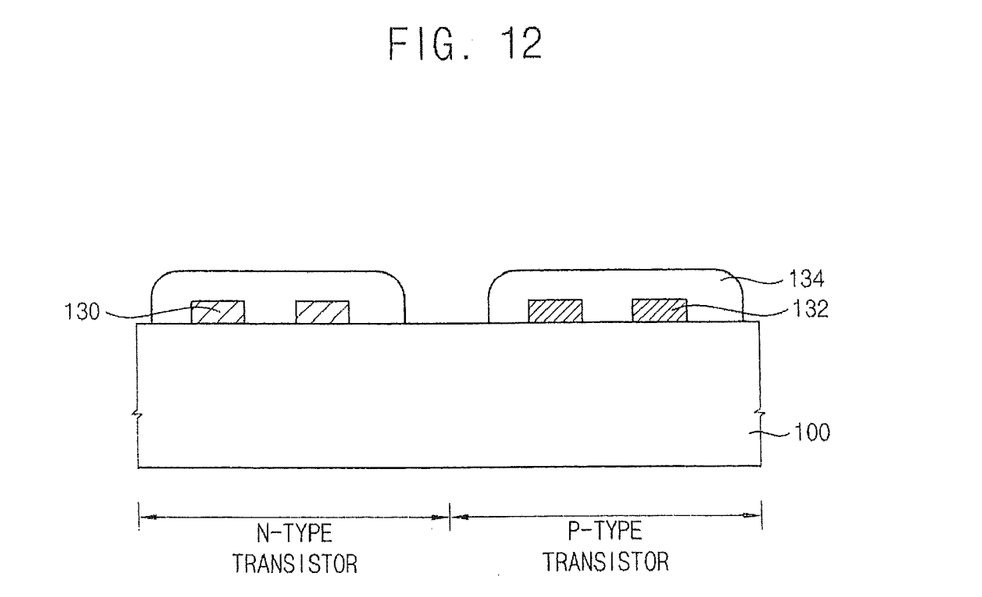
FIGS. 12 to 13 are cross-sectional views illustrating a method of manufacturing the CMOS transistor shown in FIG. 11.
Figure 13:
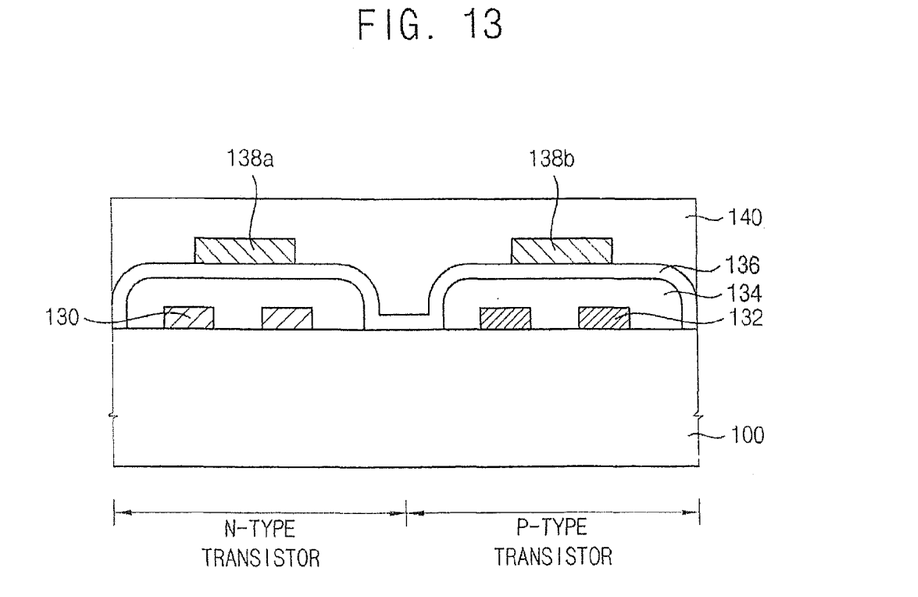

FIGS. 12 and 13 are cross-sectional views illustrating a method of manufacturing a CMOS transistor shown in FIG. 11.

Referring to FIG. 12, the ohmic contacts 130 may be formed on the substrate 100 as the first source and drain electrodes of the n-type transistor. The ohmic contact 130 may be formed on the substrate 100 in a printing process by depositing a metal material of which the work function may be lower than that of the n-type semiconductor channel 134.

Further, the Schottky contacts 132 may be formed on the substrate 100 as the second source and drain electrodes of the p-type transistor. The Schottky contact 132 may be formed on the substrate 200 in a printing process by depositing a metal material of which the work function may be higher than that of the n-type semiconductor channel 134.

While the above example embodiment discloses that the ohmic contact 130 may be formed prior to the Schottky contact 132, any changes of the formation order of the ohmic contact 130 and the Schottky contact 132 may be allowable, as would be known to one of the ordinary skill in the art.

Then, the n-type semiconductor channel 134 may be formed on the substrate 100 to a sufficient thickness to cover the ohmic and Schottky contacts 130 and 132. The n-type semiconductor channel 134 may be formed on the substrate 100 by substantially the same process as described in Embodiment 1. In the present example embodiment, the n-type semiconductor channel 134 may include a first channel covering the first ohmic contact 130 and a second channel covering the Schottky contact 132.

Referring to FIG. 13, the gate insulation layer 136 may be formed on the substrate 100 on which the ohmic and Schottky contacts 130 and 132 and the n-type semiconductor channel 134 covering the contacts 130 and 132 may be formed. Then, the first gate electrode 138a may be formed on the gate insulation layer 136 in such a manner that the first gate electrode 138a may cross over the ohmic contacts 130 and the second gate electrode 138b may be formed on the gate insulation layer 136 in such a manner that the second gate electrode 138b may cross over the Schottky contacts 132.

Thus, the gate insulation layer 136, the first gate electrode 138a and the ohmic contacts 130 may be formed into the n-type transistor of the CMOS transistor and the gate insulation layer 136, the second gate electrode 138b and the Schottky contacts 132 may be formed into the p-type transistor of the CMOS transistor.

The protection layer 140 may be formed on the substrate 100 to cover the first and second gate electrodes 138a and 138b.

Then, the first wiring (not shown) for electrically connecting the first and second gate electrodes 138a and 138b and the second wiring (not shown) electrically connected to the first and second drain electrodes may be formed on the protection layer 140.

Embodiment 3

Figure 14:
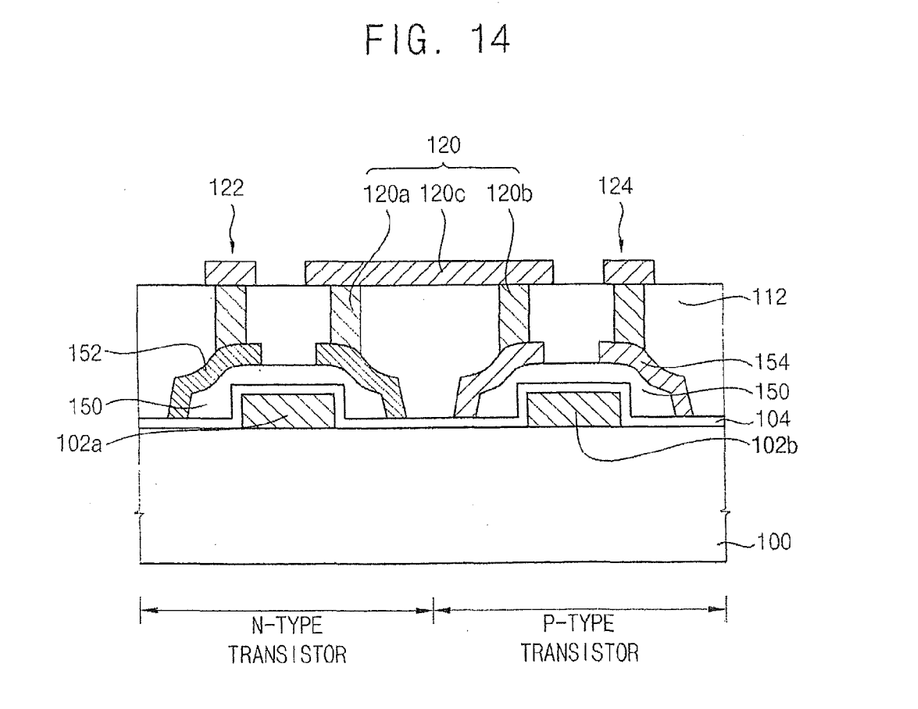
FIG. 14 is a cross-sectional view illustrating a method of manufacturing a CMOS transistor in accordance with a third example embodiment of the present inventive concept.
Figure 15:
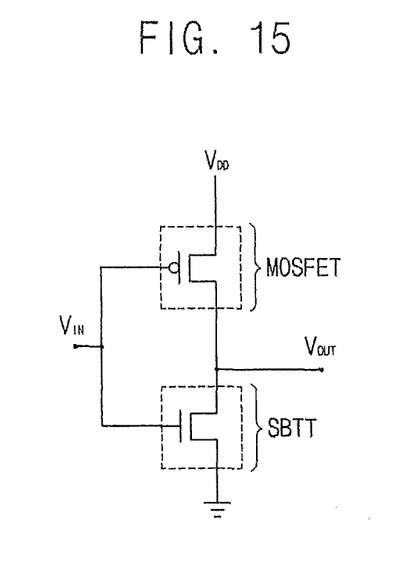
FIG. 15 is a circuit diagram of the CMOS transistor shown in FIG. 14.

FIG. 14 is a cross-sectional view illustrating a method of manufacturing a CMOS transistor in accordance with a third example embodiment of the present inventive concept. FIG. 15 is a circuit diagram of the CMOS transistor shown in FIG. 14.

In FIGS. 14 and 15, the same reference numerals denote the same element in FIGS. 1 to 3, and thus the detailed descriptions of the same elements will be omitted.

Referring to FIGS. 14 and 15, first and second gate electrodes 102a and 102b may be positioned on a substrate 100. The first and second gate electrodes 102a and 102b may have substantially the same structure as described in Embodiment 1.

A gate insulation layer 104 may be positioned on the substrate 100 and the first and second gate electrodes 102a and 102b, thus the first and second gate electrodes 102a and 102b may be covered with the gate insulation layer 104. A channel 150 including a p-type semiconductor material, which is referred to as p-type semiconductor channel, may be positioned on the gate insulation layer 104. The p-type semiconductor channel 150 may comprise a semiconductor material, which may be thermodynamically stable, when the conductivity type of the material is a p-type. In the present example embodiment, the p-type semiconductor channel 150 may be formed on the substrate 100 by a doping process with p-type impurities. For example, the p-type semiconductor channel 150 may have a nano-material structure such as a nano-wire structure, a nano-tube structure and a nano-ribbon structure. In addition, the nano-structured material for the p-type semiconductor channel 150 may be processed by a printing process.

Examples of the semiconductor material, which may be thermodynamically stable, when the conductivity type of the material is a p-type may include carbon (C), silicon carbide (SiC) and silicon (Si). However, various other p-type semiconductor compositions may be used for the semiconductor channel 150, as would be known to one of the ordinary skill in the art. Example of the p-type semiconductor compositions may include SiGe, CdS, V2O5, NiO, GaAs, ZnS, ZnSe, ZnTe, CdSe, CdTe, HgSe, HgTe, AlInP, AlGaAs, AlInAs, AlGaSb, AlInSb, GaInP, GaInAs, GaInSb, GaPAs, GaAsSb, InPAs, InAsSb and metal alloys thereof. These may be used alone or in combinations thereof.

A pair of Schottky contacts 152 may make contact with the p-type semiconductor channel 150 at both side portions thereof over the first gate electrode 102a. Thus, the first gate electrode 102a may be covered with the p-type semiconductor channel 150 and both of the side surfaces of the p-type semiconductor channel 150 over the first gate electrode 102a may be covered with the Schottky contacts 152. The pair of the Schottky contacts 152 may function as a first source electrode and a first drain electrode, respectively. In the present example embodiment, the Schottky contact 152 may have a work function lower than that of the p-type semiconductor channel 150.

In a case where the p-type semiconductor channel 106 comprises silicon (Si), the Schottky contact 152 may comprise a first conductive metal. Examples of the first conductive metal may include aluminum (Al), titanium (Ti), scandium (Sc), hafnium (Hf), lanthanum (La), etc. These may be used alone or in combinations thereof. In addition, the Schottky contact 152 may have a single-layer structure or a multilayer structure.

Accordingly, the p-type semiconductor channel 150, the gate insulation layer 104, the first gate electrode 102a and the Schottky contact 152 may function as an n-type transistor of the CMOS transistor of the present inventive concept. In the present example embodiment, the n-type transistor may include an SBTT.

A pair of ohmic contacts 154 may make contact with the p-type semiconductor channel 150 at both side portions thereof. Thus, the second gate electrode 102b may be covered with the p-type semiconductor channel 150 and both of the side surfaces of the p-type semiconductor channel 150 over the second gate electrode 102b may be covered with the ohmic contacts 154. The pair of the ohmic contacts 14 may function as a second source electrode and a second drain electrode, respectively. In the present example embodiment, the ohmic contact 154 may have a work function higher than that of the p-type semiconductor channel 150.

In a case where the p-type semiconductor channel 150 comprises silicon (Si), the ohmic contact 154 may comprise a second conductive metal. Examples of the second conductive metal may include platinum (Pt), palladium (Pd), gold (Au), InSnO, InGaSnO, etc. These may be used alone or in combinations thereof. In addition, the ohmic contact 154 may have a single-layer structure or a multilayer structure.

Accordingly, the p-type semiconductor channel 150, the gate insulation layer 104, the second gate electrode 102b and the ohmic contact 154 may function as a p-type transistor of the CMOS transistor of the present inventive concept. In the present example embodiment, the p-type transistor may include a MOSFET.

In an example embodiment, the first and second gate electrodes 102a and 102b may be electrically connected with each other by a first wiring (not shown) and the first and second drain electrodes may be electrically connected with each other by a second wiring (not shown).

The CMOS transistor of the third example embodiment of the present inventive concept includes the n-type and the p-type transistors that are formed on the same p-type channel 150. Particularly, the p-type transistor may include a p-type MOSFET and the n-type transistor may include the n-type SBTT.

The CMOS transistor in Embodiment 3 may be manufactured by substantially the same process as described in Embodiment 1 with reference to FIGS. 1 to 10, except the conductivity type of the semiconductor channel and the contact type of the p-type and n-type transistors. The semiconductor channel in Embodiment 3 may comprise a p-type semiconductor material instead of an n-type semiconductor material. In addition, the p-type transistor may include the ohmic contacts and the n-type transistor may include the Schottky contact in the CMOS transistor in Embodiment 3, while the n-type transistor may include the ohmic contacts and the p-type transistor may include the Schottky contacts in the CMOS transistor in Embodiment 1.

Embodiment 4

Figure 16:
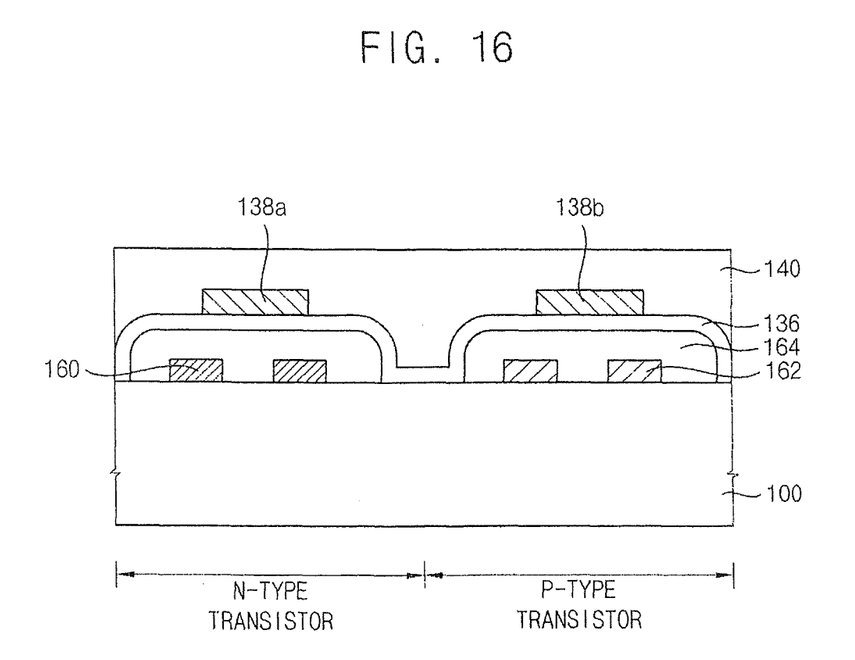
FIG. 16 is a cross-sectional view illustrating a CMOS transistor in accordance with a fourth example embodiment of the present inventive concept.

FIG. 16 is a cross-sectional view illustrating a CMOS transistor in accordance with a fourth example embodiment of the present inventive concept.

The CMOS transistor in Embodiment 4 may have the same structure as the CMOS transistor in Embodiment 3, except that the p-type and n-type transistors in the CMOS may have a top gate structure. In addition, the circuit diagram of the CMOS transistor shown in FIG. 16 may be the same as the circuit diagram shown in FIG. 15.

In FIG. 16, the same reference numerals denote the same element in FIG. 11, and thus the detailed descriptions on the same elements will be omitted.

Referring to FIG. 16, a pair of Schottky contacts 160 may be formed on a substrate 100 and the Schottky contacts 160 may function as a first source electrode and a first drain electrode. For example, the substrate 100 may comprise an insulation material and the Schottky contact 160 may comprise a metal material having a work function lower than that of a p-type semiconductor channel.

In an example embodiment, a pair of ohmic contacts 162 may be formed on the substrate 100 and the ohmic contacts 162 may function as a second source electrode and a second drain electrode. For example, the ohmic contact 162 may comprise a metal material having a work function higher than that of a p-type semiconductor channel.

A p-type semiconductor channel 164 may be positioned on the substrate 100 in such a manner that the Schottky contacts 160 and the ohmic contacts 162 may be covered with the channel 164, respectively. For example, the p-type semiconductor channel 164 may include the same material as described in Embodiment 3.

A gate insulation layer 136 may be formed on the semiconductor channel 164 and the substrate 100. A first gate electrode 138a may be positioned on the gate insulation layer 136 in such a configuration that the first gate electrode 138a may cross over the Schottky contacts 160. Accordingly, the gate insulation layer 136, the first gate electrode 138a and the first source and drain electrodes of the Schottky contacts 160 may function as an n-type transistor of the CMOS transistor of the present inventive concept.

Further, a second gate electrode 138b may be positioned on the gate insulation layer 136 in such a configuration that the second gate electrode 138b may cross over the ohmic contacts 162. Accordingly, the gate insulation layer 136, the second gate electrode 138b and the second source and drain electrodes of the ohmic contacts 162 may function as a p-type transistor of the CMOS transistor of the present inventive concept.

A protection layer 140 may be positioned on the gate insulation layer 136 and have a sufficient thickness to cover the first and second gate electrodes 138a and 138b.

The first and second gate electrodes 138a and 138b may be electrically connected to each other through a first wiring (not shown) and the first and the second drain electrodes may be electrically connected with each other through a second wiring (not shown) in the same structure as described in Embodiment 2. The first and second wirings may comprise a metal.

The CMOS transistor in Embodiment 4 may be manufactured by substantially the same process as described in Embodiment 2 with reference to FIGS. 12 to 13, except the conductivity type of the semiconductor channel and the contact type of the p-type and n-type transistors. The semiconductor channel in Embodiment 4 may comprise a p-type semiconductor material instead of an n-type semiconductor material. In addition, the p-type transistor may include the ohmic contacts and the n-type transistor may include the Schottky contact in the CMOS transistor in Embodiment 4, while the n-type transistor may include the ohmic contacts and the p-type transistor may include the Schottky contacts in the CMOS transistor in Embodiment 2.

Figure 17:
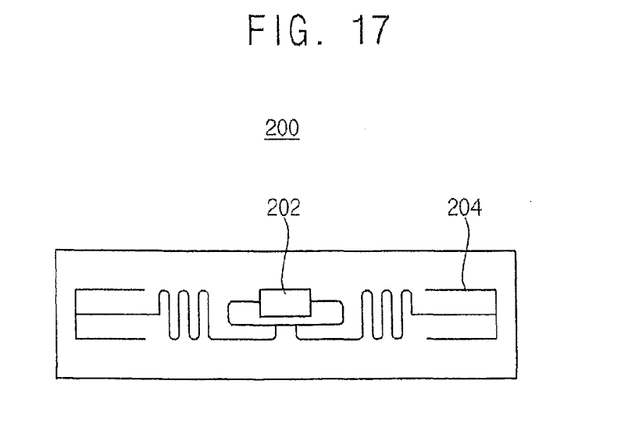
FIG. 17 is a plan view illustrating a radio frequency identification (RFID) tag in accordance with an example embodiment of the present inventive concept.

FIG. 17 is a plan view illustrating a radio frequency identification (RFID) tag in accordance with an example embodiment of the present inventive concept.

Referring to FIG. 17, an RFID tag 200 of an example embodiment of the present inventive concept may include an integrated circuit (IC) chip 202 and an antenna 204. For example, the IC chip 202 may include a signal circuit for transmitting and receiving a radio frequency (RF) signal, a logic circuit for controlling the signal circuit and a memory. The RF signal may be transmitted from or received to the RFID tag 200 through the antenna 204. The signal circuit may include a CMOS transistor of an example embodiment of the present inventive concept. The RFID tag 200 may receive an RF signal that is generated from an RFID reader unit (not shown) in the ultra-high frequency (UHF) bandwidth and transmit again, or reflect, the RF signal to the RFID reader simultaneously with modulated information signals including identification data. The RFID tag 200 includes a CMOS transistor of an example embodiment of the present inventive concept, and thus power for operating the RFID tag may be efficiently transferred from the RFID reader to thereby improve the reliability of data communication between the RFID tag 200 and the RFID reader.

Figure 18:
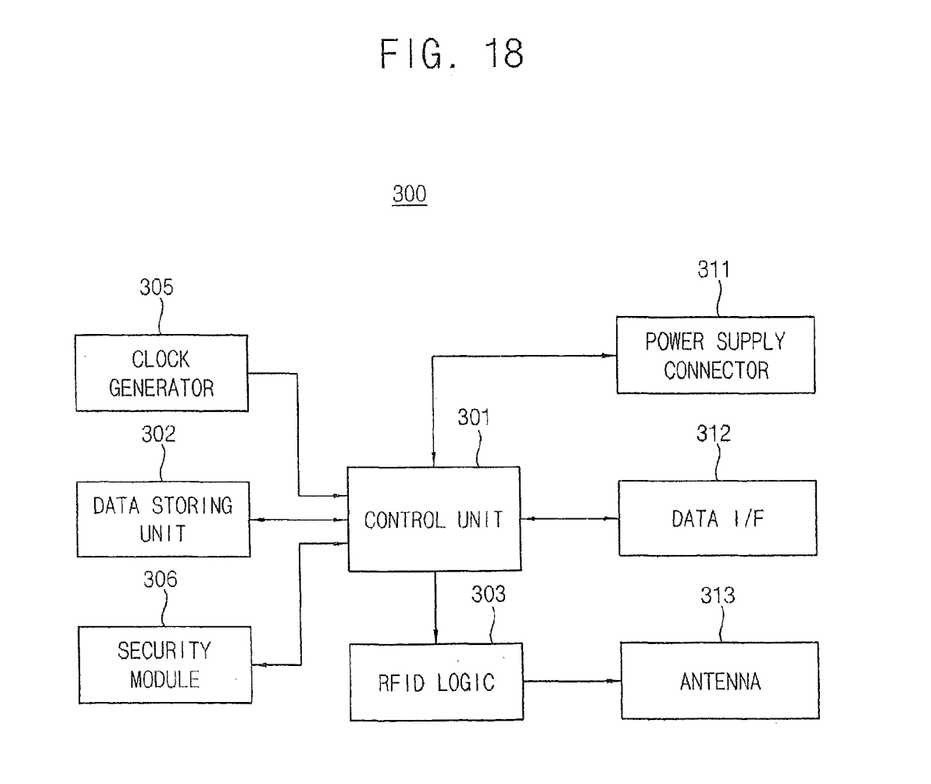
FIG. 18 is a block diagram illustrating the memory module for a smart card in accordance with an example embodiment of the present inventive concept.

FIG. 18 is a block diagram illustrating the memory module for a smart card in accordance with an example embodiment of the present inventive concept.

Referring to FIG. 18, a memory module 300 for a smart card may be controlled by a control unit 301 such as a microcontroller (μC) that may be electrically connected to a data storing unit 302. Digital information such as digital data and a data record may be stored in the data storing unit 302. In an example embodiment, the data storing unit 302 may include a flash random access memory (RAM) device in which the digital information may be accessible in a reading mode and a writing mode and a read-only memory (ROM) device in which the digital information may only be accessible in a reading mode. While the present example embodiment discusses the flash RAM device and the ROM device as the data storing unit 302, any other devices manufactured by various data storage technology may be used as the data storing unit 302, as would be known to one of the ordinary skill in the art.

In an example embodiment, the digital information may be transferred to/from the data storing unit 302 via a data interface 312. A data interface of a portable device such as a mobile phone or a notebook computer may be electrically connected to the data interface 312 of the memory module 300 of a smart card via a connector such as an electrical cable.

In another example embodiment, the digital information may be transferred to/from the data storing unit 302 via an RFID logic unit 303 having a signal circuit for transmitting or receiving an RF signal. The signal circuit may include a CMOS transistor of an example embodiment of the present inventive concept.

The radio frequency (RF) signal may be generated in the RFID logic unit 303 and may be transmitted to the portable device through an antenna 313. The digital information of the data storing unit 302 may be transferred to the control unit 301 as data signals and the RFID logic unit 303 may receive the data signals from the control unit 301. The data signal may include an instruction for controlling the control unit 301 and/or data information that are to be written in the data storing unit 302. Then, the data signal may be modulated into a bandwidth of an RF signal. Clock signals for operating the control unit 301 and the RFID logic unit 303 may be provided by a clock generator 305 or may be generated from an RF signal applied to the RFID logic 303.

A power supply connector 311 may provide electrical power with the memory module 300 of a smart card. The power supply connector 311 is desirably connected with a power supply of the portable device such as a battery and/or a rechargeable condenser. Electrical power is provided to the memory module 300 of the smart card through an external power source.

The memory module 300 of a smart card may include a security module 306 in which security data for protecting the information in the smart card from external surroundings. For example, the security data may include password logic and a verification mechanism in accordance with various security requirements.

According to the example embodiments of the present inventive concept, manufacturing costs of a CMOS transistor may be significantly reduced without any deterioration of operational performance. Therefore, the CMOS transistor of the present inventive concept may be employed in various electric devices and communication devices that are required to be manufactured at low cost. Particularly, the CMOS transistor may be actively employed in an electronic communication device such as an RFID chip in view of lower manufacturing costs and higher operation efficiency.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a CMOS transistor, the method comprising:
   forming first and second gate electrodes on a substrate;
   forming a gate insulation layer on the first and second gate electrodes;
   forming a semiconductor channel material having a first conductivity type on the gate insulation layer;
   forming a pair of ohmic contacts on the semiconductor channel material such that the ohmic contacts cross over both side portions of the first gate electrode, respectively; and
   forming a pair of Schottky contacts on the semiconductor channel material such that the Schottky contacts cross over both side portions of the second gate electrode, respectively.

2. The method of claim 1, wherein the semiconductor channel material is formed on the gate insulation layer by printing an n-type semiconductor material.

3. The method of claim 2, wherein the ohmic contact is formed on the semiconductor channel material by depositing a material having a work function less than that of the semiconductor channel material onto the semiconductor channel material in a first area of the substrate in a printing process.

4. The method of claim 2, wherein the Schottky contact is formed on the semiconductor channel material by depositing a material having a work function greater than that of the semiconductor channel material onto the semiconductor channel material in a second area of the substrate in a printing process.

5. The method of claim 1, wherein the semiconductor channel material is formed on the gate insulation layer by printing a p-type semiconductor material.

6. The method of claim 5, wherein the ohmic contact is formed on the semiconductor channel material by depositing a material having a work function less than that of the semiconductor channel material onto the semiconductor channel material in a first area of the substrate in a printing process.

7. The method of claim 5, wherein the Schottky contact is formed on the semiconductor channel material by depositing a material having a work function greater than that of the semiconductor channel material onto the semiconductor channel material in a second area of the substrate in a printing process.

8. The method of claim 1, wherein the semiconductor channel material comprises a semiconductor material having one of a nano-wire structure, a nano-tube structure and a nano-ribbon structure.

9. The method of claim 1, further comprising:
   forming a first wiring electrically connecting the first and second gate electrodes with each other; and
   forming a second wiring electrically connecting one of the ohmic contacts and one of the Schottky contacts with each other.

10. A method of manufacturing a CMOS transistor, the method comprising:
    forming a semiconductor channel material having a first conductivity type on a substrate;

forming a gate insulation layer on the semiconductor channel material;

forming first and second gate electrodes on the gate insulation layer;

forming a pair of ohmic contacts to make contact with the semiconductor channel material and to cross over both side portions of the first gate electrode, respectively; and forming a pair of Schottky contacts to make contact with the semiconductor channel material and to cross over both side portions of the second gate electrode, respectively.

* * * * *